United States Patent
Wright et al.

(10) Patent No.: US 9,407,257 B2
(45) Date of Patent: Aug. 2, 2016

(54) REDUCING POWER CONSUMPTION IN A LIQUID CRYSTAL DISPLAY

(75) Inventors: David Wright, San Diego, CA (US);
Jason Muriby, San Diego, CA (US);
Erhan Hancioglu, San Diego, CA (US);
Harold Kutz, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1452 days.

(21) Appl. No.: 11/855,281

(22) Filed: Sep. 14, 2007

(65) Prior Publication Data

US 2008/0259017 A1    Oct. 23, 2008

Related U.S. Application Data

(60) Provisional application No. 60/912,577, filed on Apr. 18, 2007.

(51) Int. Cl.
*G09G 3/36* (2006.01)
*H03K 17/687* (2006.01)
*H03K 19/003* (2006.01)
*H03K 19/00* (2006.01)

(52) U.S. Cl.
CPC .......... *H03K 17/687* (2013.01); *H03K 19/0016* (2013.01); *H03K 19/00369* (2013.01)

(58) Field of Classification Search
CPC .......... H03K 19/00369; H03K 17/687; H03K 19/0016
USPC .................. 345/55, 175, 212, 100, 105, 211, 345/87–89, 94, 97–98
See application file for complete search history.

(56) References Cited

U.S. PATENT DOCUMENTS

| | | |
|---|---|---|
| 4,571,507 A | 2/1986 | Collings |
| 4,692,760 A | 9/1987 | Unno et al. |
| 4,839,636 A | 6/1989 | Zeiss |
| 4,988,983 A * | 1/1991 | Wehrer .................. 345/175 |
| 5,508,715 A | 4/1996 | Kuroki |
| 5,845,181 A | 12/1998 | Bartscher |
| 5,867,015 A | 2/1999 | Corsi et al. |
| 5,949,408 A | 9/1999 | Kang et al. |

(Continued)

OTHER PUBLICATIONS

International Search Report for International Application No. PCT/US08/60699 dated Jun. 18, 2009; 2 pages.

(Continued)

*Primary Examiner* — Jennifer Nguyen
*Assistant Examiner* — Tony Davis

(57) ABSTRACT

Embodiments of the invention relate to a method and apparatus to reduce power consumption in a passive matrix LCD driver circuit by using a plurality of drive buffers and active power management of sub-blocks in the passive matrix LCD drive circuit. Each drive buffer may operate in a first phase, which may include a high-drive mode to drive an LCD voltage to a threshold voltage level and a low-drive mode to modify the LCD voltage to approximate an input voltage of the drive buffer, and to maintain a constant LCD voltage level. The low-drive buffer consumes less current than the high-drive buffer, thus reducing power consumption. The drive buffer may also operate in a second phase, also a no-drive mode, in which the drive buffer and the bias voltage generator may be completely turned off, to further reduce power consumption. The drive buffer may be used to drive capacitive loads, as well as partially-resistive loads and inductive loads.

18 Claims, 8 Drawing Sheets

(56) References Cited

U.S. PATENT DOCUMENTS

| | | | |
|---|---|---|---|
| 6,118,439 A * | 9/2000 | Ho et al. | 345/211 |
| 6,124,840 A * | 9/2000 | Kwon | 345/100 |
| 6,204,831 B1 | 3/2001 | Nishioka et al. | |
| 6,225,992 B1 | 5/2001 | Hsu et al. | |
| 6,701,508 B1 | 3/2004 | Bartz et al. | |
| 6,801,178 B2 | 10/2004 | Nitta et al. | |
| 6,812,678 B1 | 11/2004 | Brohlin | |
| 6,909,414 B2 * | 6/2005 | Tsuchi et al. | 345/89 |
| 6,960,953 B2 | 11/2005 | Ichihara | |
| 6,966,039 B1 | 11/2005 | Bartz et al. | |
| 6,989,659 B2 | 1/2006 | Menegoli et al. | |
| 7,010,773 B1 | 3/2006 | Bartz et al. | |
| 7,319,999 B2 | 1/2008 | Evans | |
| 7,348,861 B1 | 3/2008 | Wu et al. | |
| 7,391,204 B2 | 6/2008 | Bicking | |
| 7,397,226 B1 | 7/2008 | Mannama et al. | |
| 7,612,527 B2 | 11/2009 | Hoffman et al. | |
| 7,667,708 B2 | 2/2010 | Kamijo et al. | |
| 8,085,020 B1 | 12/2011 | Bennett | |
| 2001/0040569 A1 * | 11/2001 | Liang | 345/212 |
| 2002/0011979 A1 | 1/2002 | Nitta et al. | |
| 2003/0112215 A1 * | 6/2003 | Hector et al. | 345/98 |
| 2003/0122734 A1 * | 7/2003 | Chien et al. | 345/55 |
| 2004/0046724 A1 * | 3/2004 | Woo et al. | 345/87 |
| 2004/0056833 A1 | 3/2004 | Kitagawa et al. | |
| 2004/0070559 A1 * | 4/2004 | Liang | 345/87 |
| 2004/0145551 A1 * | 7/2004 | Tobita | 345/87 |
| 2004/0189573 A1 * | 9/2004 | Lee et al. | 345/94 |
| 2004/0217799 A1 | 11/2004 | Ichihara | |
| 2005/0052394 A1 | 3/2005 | Waterman | |
| 2005/0057482 A1 * | 3/2005 | Youngblood et al. | 345/100 |
| 2005/0140659 A1 | 6/2005 | Hohl et al. | |
| 2006/0001671 A1 | 1/2006 | Kamijo et al. | |
| 2006/0192791 A1 | 8/2006 | Schick et al. | |
| 2006/0239746 A1 | 10/2006 | Grant | |
| 2006/0244739 A1 | 11/2006 | Tsai | |
| 2006/0255860 A1 * | 11/2006 | Moussavi | 330/278 |
| 2007/0002007 A1 * | 1/2007 | Tam | 345/105 |
| 2007/0139338 A1 | 6/2007 | Lin et al. | |
| 2007/0139403 A1 | 6/2007 | Chung | |
| 2007/0159425 A1 | 7/2007 | Knepper et al. | |
| 2008/0123238 A1 * | 5/2008 | Campos et al. | 361/103 |
| 2008/0131145 A1 | 6/2008 | Tao et al. | |
| 2008/0203977 A1 | 8/2008 | Raimar et al. | |
| 2008/0259070 A1 | 10/2008 | Snyder et al. | |
| 2009/0054129 A1 | 2/2009 | Yoshimura et al. | |
| 2011/0234264 A1 | 9/2011 | Wright et al. | |
| 2011/0248692 A1 | 10/2011 | Shehu et al. | |

OTHER PUBLICATIONS

Jinbin Zhao, et al., "Steady-State and Dynamic Analysis of a Buck Converter Using a Hysteretic PWM Control" Dated 2004; 5 pages.

Mohammad Al-Shyoukh and Hoi Lee__A Compact Fully-Integrated Extremum-Selector-Based Soft-Start Circuit for Voltage Regulators in Bulk CMOS Technologies__Oct. 2010__5 pages.

USPTO Advisory Action for U.S. Appl. No. 11/965,520 dated Aug. 23, 2011; 3 pages.

USPTO Advisory Action for U.S. Appl. No. 11/965,520 dated Sep. 11, 2013; 3 pages.

USPTO Advisory Action for U.S. Appl. No. 11/965,520 dated Oct. 17, 2012; 2 pages.

USPTO Final Rejection for U.S. Appl. No. 11/965,520 dated Jun. 8, 2011; 14 pages.

USPTO Final Rejection for U.S. Appl. No. 11/965,520 dated Jul. 8, 2013; 10 pages.

USPTO Final Rejection for U.S. Appl. No. 11/965,520 dated Aug. 6, 2012; 13 pages.

USPTO Non-Final Rejection for U.S. Appl. No. 11/965,520 dated Sep. 29, 2010; 11 pages.

USPTO Non-Final Rejection for U.S. Appl. No. 11/965,520 dated Dec. 7, 2011; 11pages.

USPTO Non-Final Rejection for U.S. Appl. No. 11/965,520 dated Dec. 18, 2012; 13 pages.

USPTO Notice of Allowance for U.S. Appl. No. 11/965,520 dated Nov. 18, 2013; 7 pages.

Written Opinion of the International Searching Authority for International Application No. PCT/US2008/60699 dated Jun. 18, 2009; 4 pages.

\* cited by examiner

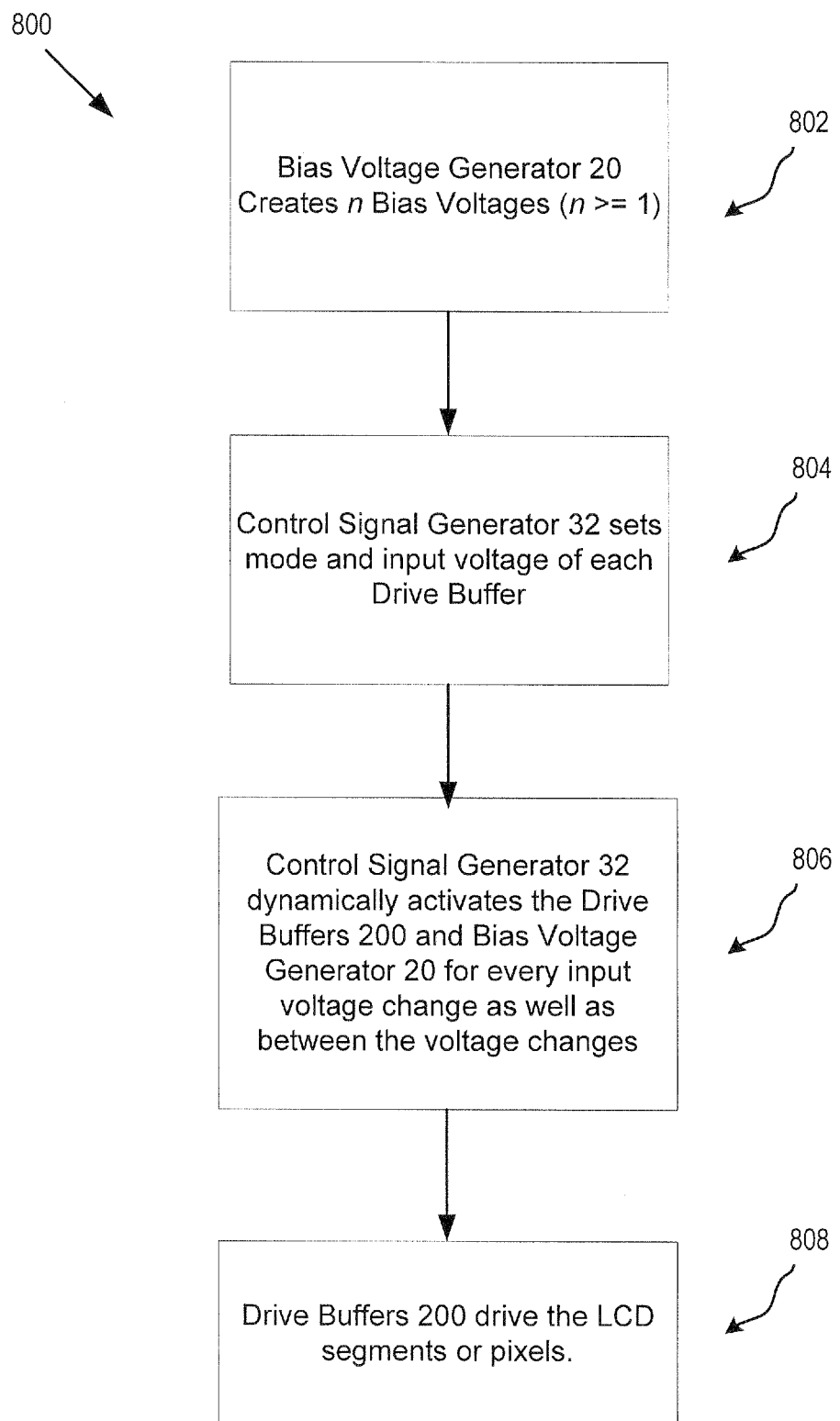

REDUCING POWER CONSUMPTION IN A LIQUID CRYSTAL DISPLAY

RELATED APPLICATIONS

This application claims the benefit of U.S. Provisional Application No. 60/912,577, filed Apr. 18, 2007, which is incorporated herein by reference.

TECHNICAL FIELD

The present disclosure relates generally to integrated circuits, and more particularly to a method and apparatus for reducing power consumption in a passive matrix liquid crystal display (LCD) driver circuit.

BACKGROUND

There are several types of liquid crystal displays (LCDs). For example, many watches utilize segment liquid crystal displays, in which each segment of liquid crystal material can be arranged into a template or pattern which can form any numeral (and virtually any letter). Each segment is then controlled to simply turn "on" or "off"; that is, transmit maximum light (appears brighter or white) or not (appears dim or black). Some advantages of segment LCDs include the small amount of space required by the display and the circuitry driving it, as well as low power consumption.

For more complex displays, such as those found in personal organizers or laptop computer monitors, a matrix LCD structure is normally utilized. A large number of small independent regions of liquid crystal material are positioned in a plane. Each of these regions is generally called a picture element or pixel. These pixels are arranged in rows and columns forming a matrix. Corresponding numbers of column and row electrodes are correlated with the rows and columns of pixels. An electric potential can therefore be applied to any pixel by the selection of appropriate row and column electrodes and a desired graphic can then be generated.

There are different types of matrix LCDs, such as active matrix LCDs and passive matrix LCDs. A passive matrix LCD uses a simple conductive grid to deliver current to the liquid crystals in the target area. Each row or column of the display has a single electrical circuit. The pixels are addressed one at a time by row and column addresses. As the number of pixels increases, however, this type of display becomes less feasible. Slow response time and poor contrast are typical of passive matrix LCDs.

In a conventional LCD driver circuit for driving a passive matrix LCD, passive devices such as resistive voltage dividers may be used to generate different bias voltages. This approach requires the LCD driver circuit to be active continuously which results high power consumption.

DESCRIPTION OF EXAMPLE EMBODIMENTS

Overview

An apparatus includes means for generating an input voltage; means for actively driving a voltage associated with a passive liquid crystal display (LCD) segment or pixel to a threshold level in a first phase; means for modifying the voltage associated with the passive LCD segment or pixel to approximate the input voltage in the first phase; means for compensating a leakage associated with the passive LCD segment or pixel to maintain the voltage associated with the passive LCD segment or pixel at a substantially constant level in the first phase; and means for ceasing to drive the passive LCD segment or pixel in a second phase. The second phase consumes less current than the first phase, reducing power consumption.

A method includes generating an input voltage; actively driving a voltage associated with a passive liquid crystal display (LCD) segment or pixel to a threshold level in a first phase; modifying the voltage associated with the passive LCD segment or pixel to approximate the input voltage in the first phase; compensating a leakage associated with the passive LCD segment or pixel to maintain the voltage associated with the passive LCD segment or pixel at a substantially constant level in the first phase; and ceasing to drive the passive LCD segment or pixel after the voltage associated with the passive LCD segment or pixel in a second phase.

BRIEF DESCRIPTION OF THE DRAWINGS

The foregoing and other objects, advantages and features will become more readily apparent by reference to the following detailed description in conjunction with the accompanying drawings.

FIG. 8 is a flow diagram illustrating an example use of the passive matrix LCD driver circuit of FIG. 1.

DETAILED DESCRIPTION

Figure 1:
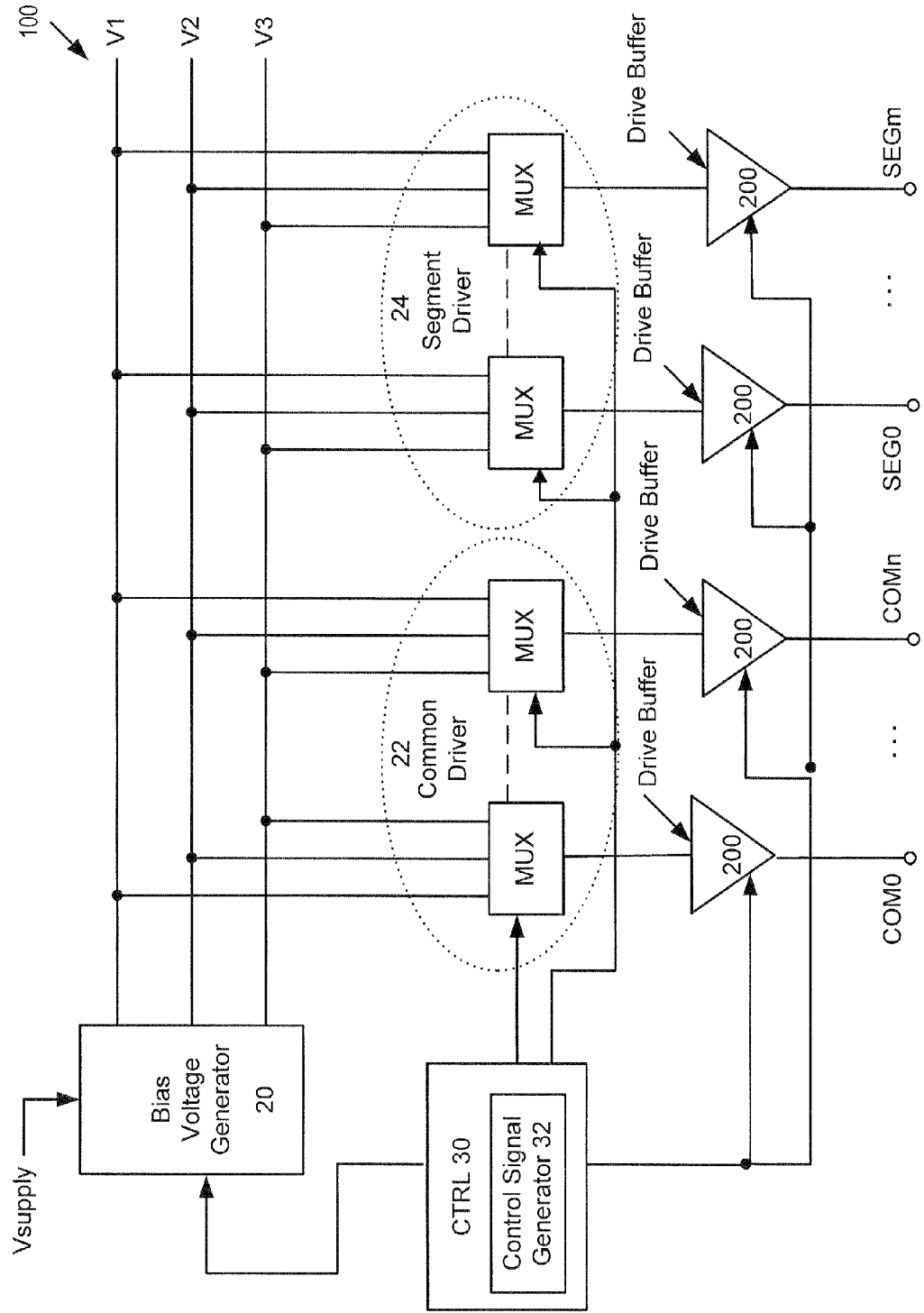
FIG. 1 is a schematic block diagram illustrating an example passive matrix LCD driver circuit according to embodiments of the invention.

FIG. 1 is a schematic block diagram illustrating an example passive matrix LCD driver circuit 100 according to embodiments of the invention. It should be recognized that FIG. 1 may include other elements, which have not been illustrated in order to simplify the figures and which are not necessary to understand the example system disclosed below. The passive matrix LCD driver circuit 100 described and illustrated herein may be implemented in hardware, firmware, software, or any suitable combination thereof.

Referring to FIG. 1, the passive matrix LCD driver circuit 100 includes a bias voltage generator 20 to generate multiple bias voltages, such as V1, V2, and V3. The bias voltages V1, V2, and V3 may each represent a different voltage level. Although FIG. 1 shows the bias voltage generator 20 outputting three bias voltages V1, V2, and V3, the bias voltage generator 20 may output any number of bias voltages of various voltage levels. The bias voltages V1, V2, and V3 may allow the passive matrix LCD driver circuit 100 to output a plurality of analog LCD waveforms, such as common signals COM1-COMn and segment signals SEG1-SEGm, to an LCD panel (not shown). These LCD waveforms represent the data or graphics that are to be displayed on the LCD panel.

Unlike conventional passive matrix LCD drivers, the bias voltage generator 20 does not require any external capacitors, which may be connected to the nodes where the bias voltages V1, V2, and V3 are produced. These external capacitors are typically required by the conventional passive matrix LCD drivers to support large transient current flows.

The passive matrix LCD driver circuit 100 includes a segment driver circuit 24 and a common driver circuit 22. The common driver circuit 22 outputs signals associated with the rows or number of lines of the LCD panel, while the segment driver circuit 24 outputs the necessary signals associated with the characters or columns of the LCD panel. The common driver circuit 22 includes a plurality of common drivers. In some embodiments, each common driver may associate with a corresponding multiplexer (MUX), to select at least one of the bias voltages, V1, V2, and V3 responsive to signaling from a control circuit 30. The output voltage from each common driver may be provided to a corresponding driver buffer 200.

The segment driver circuit 24 includes a plurality of segment drivers. In some embodiments, each segment driver may also associate with a corresponding multiplexer (MUX), to select at least one of the bias voltages, V1, V2, and V3 responsive to signaling from a control circuit 30. The output voltage from each segment driver may then be provided to a corresponding driver buffer 200. The drive buffers 200 may output common signals COM0-COMn responsive to selected bias voltages from the common driver circuit 22 and segment signals SEG0-SEGm responsive to selected bias voltages from the segment driver circuit 24 to drive an LCD segment or pixel (not shown).

The control logic 30 may include a control signal generator 32 to generate and provide signaling to the common driver circuit 22 and the segment driver circuit 24. The signaling may indicate to the common driver circuit 22 and the segment driver circuit 24 which bias voltages V1, V2, and V3 that the common driver circuit 22 and the segment driver circuit 24 should select. The control circuit 30 may also generate appropriate control signals to enable the operation of the bias voltage generator 20 and the drive buffers 200. In some embodiments, the control signal generator 32 may dynamically activate the bias voltage generator 20 and the drive buffer 200 when the input voltage of the drive buffer 200 changes, while in other embodiments, the control signal generator 32 may dynamically activate the bias voltage generator 20 and the drive buffer 200 when the input voltage of the drive buffer 200 changes, as well as between the changes. Embodiments of the control circuit 30 will be described later in greater detail.

In some embodiments, the drive buffer 200 has multiple modes of operation, such as a high-drive mode and a low-drive mode, to drive an LCD segment or pixel. For example, when the drive buffer 200 operates in the high-drive mode, a bias current in the drive buffer 200 may be increased to drive an output voltage of the drive buffer 200 to a threshold voltage level. The threshold voltage level may be programmable or fixed.

Subsequently, the drive buffer 200 may switch to a low-drive mode to modify the output voltage of the drive buffer 200 to approximate an input voltage of the drive buffer 200. During the low-drive mode, the drive buffer 200 may compensate the leakage of the LCD segment or pixel to maintain a constant output voltage level. In the low-drive mode, the bias current in the drive buffer 200 may be maintained at a lower level than in the high-drive mode, thereby reducing the overall power consumption.

After the output voltage of the drive buffer 200 reaches a desired level, the drive buffer 200 may cease to drive the LCD segment or pixel, or switch to a no-drive mode. In this no-drive mode, the drive buffer 200 and the bias voltage generator 20 may be turned off, further reducing power consumption.

The control logic 30 may provide appropriate control signals to the drive buffer 200 to indicate which mode of operation, e.g., the high drive mode, the low drive mode, or the no-drive mode, may be used for driving an LCD segment or pixel. The timing associated with each of these modes may be programmable for a dynamic switching between the modes or fixed depending on the LCD segment or pixel. In some embodiments, the drive buffer 200 may switch to the appropriate mode automatically. In some embodiments, the drive buffer 200 may be implemented using two or more discrete drivers, while in other embodiments, the drive buffer 200 may be implemented using a single driver with two or more operational modes controllable by a bias current.

Figure 2:
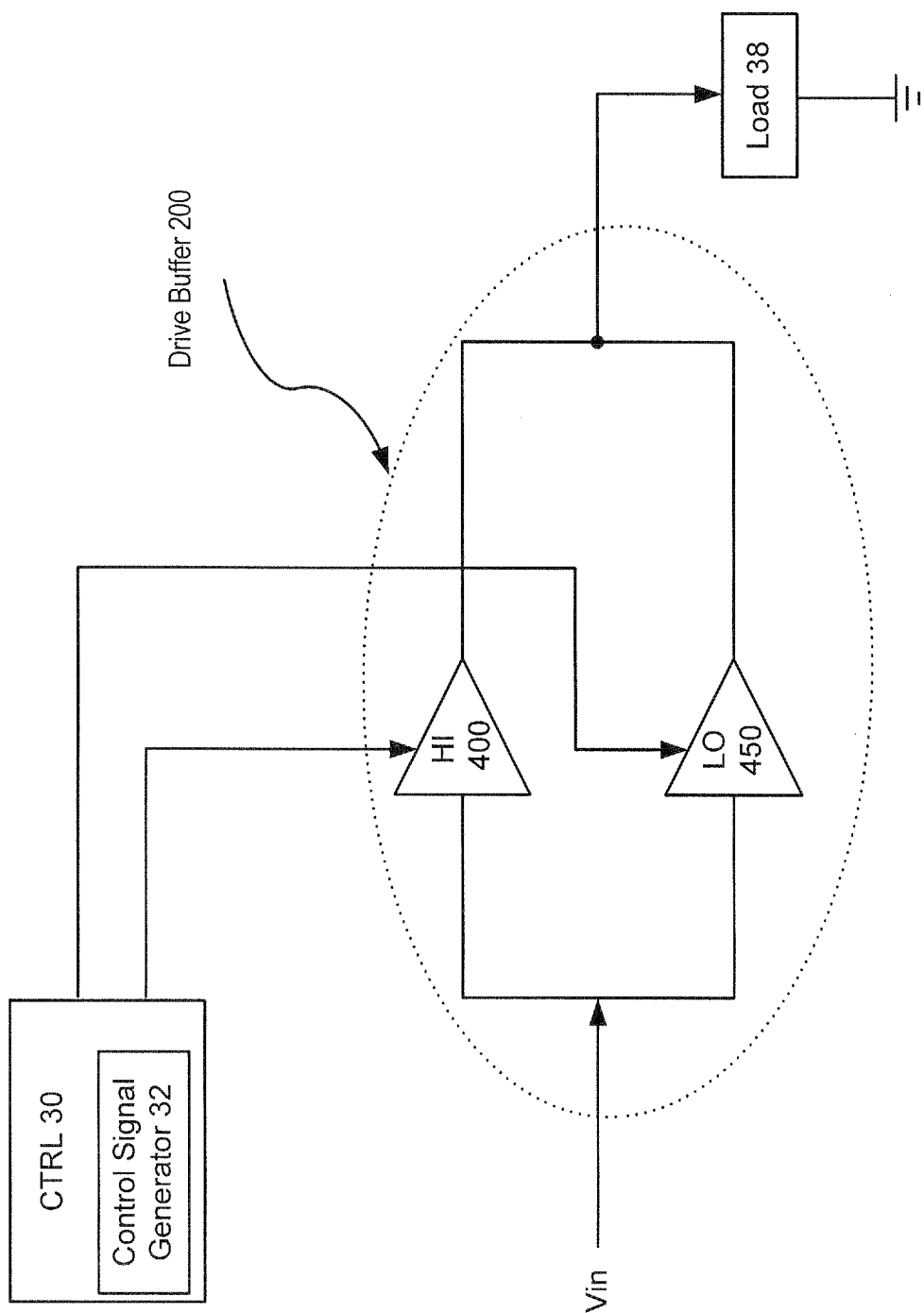
FIG. 2 is a schematic block diagram illustrating an example drive buffer of FIG. 1.

FIG. 2 is a schematic block diagram illustrating an example drive buffer 200 of FIG. 1. Referring to FIG. 2, the driver buffer 200 may include a high-drive buffer 400 and a low-drive buffer 450 to drive a load 38, such as an LCD segment or pixel. Vin represents an input voltage to the drive buffer 200. The input voltage Vin may be one of the selected bias voltages V1, V2, and V3 in FIG. 1. The control logic 30 includes a control signal generator 32 that generates appropriate control signals to select which drive buffer 400 or 450 may be used to drive the load 38. The control logic 30 may also control the amount of time that each drive buffer 400 and 450 may operate. The amount of time that each drive buffer 400 and 450 operates may be programmable for a dynamic switching between each drive buffers 400 and 450 or fixed depending on the load 38. In some embodiment, each drive buffer 400 and 500 may automatically switch between different modes according to the voltage level of the load 38. Additionally, the control logic 30 may control the drive modes according to the voltage level of the load 38. In some embodiments, the drive buffer 200 may drive capacitive loads other than the LCD segments or pixels, as well as partially-resistive loads and inductive loads.

The drive buffer 200 may operate in a high-drive mode and a low-drive mode for driving the load 38. During the high-drive mode, the high-drive buffer 400 may be selected to actively drive the load 38 to a threshold voltage level. Subsequently, the driver buffer 200 may switch to a low-drive mode in which the low-drive buffer 450 is activated. During the low-drive mode, the low-driver buffer 450 may modify the output voltage of the drive buffer 200 (i.e., voltage level associated with the load 38) to approximate the input voltage Vin. In addition, the low-drive buffer 450 may compensate the leakage of the load 38 to maintain a constant output voltage level. The low-drive circuit 450 consumes less current than the high-drive circuit 400, thereby reducing power consumption. When driving an LCD segment or pixel, the drive buffer 200 may cease to drive the LCD segment or pixel, or switch to a no-drive mode, after the output voltage of the drive buffer 200 reaches a desired level. In this no-drive mode, both the high-drive buffer 400 and the low-drive buffer 450 may be turned off, further reducing power consumption. Also, during the no-drive mode, the bias voltage generator 20 may be turned off since the drive buffer 200 may provide a high impedance output to the LCD segment or pixel. In some embodiments, the low-drive buffer 450 may be active concurrently with the high-drive buffer 400 to enable transition from the high-drive mode to the low-drive mode.

When driving non-capacitive loads, such as inductive loads, the low-drive buffer 450 may have to remain turned on in order to maintain an appropriate voltage at the output of the driver buffer 200.

The control logic 30 may provide appropriate control signals to the drive buffer 200 to indicate which mode of operation, e.g., the high-drive mode, the low-drive mode, or the no-drive mode, may be used for driving the load 38, e.g., an LCD segment or pixel. The timing associated with each of these modes may be programmable for a dynamic switching between the modes or fixed depending on the load 38 or the input and output voltages of the drive buffer 200.

The low-drive buffer 450 may include an amplifier with chopper offset cancellation that switches between an input, an output, and some internal nodes of the drive buffer 200 to cancel out any offset voltages. In some embodiments, a chopping frequency associated with the chopper offset cancellation may be programmable.

Figure 3:
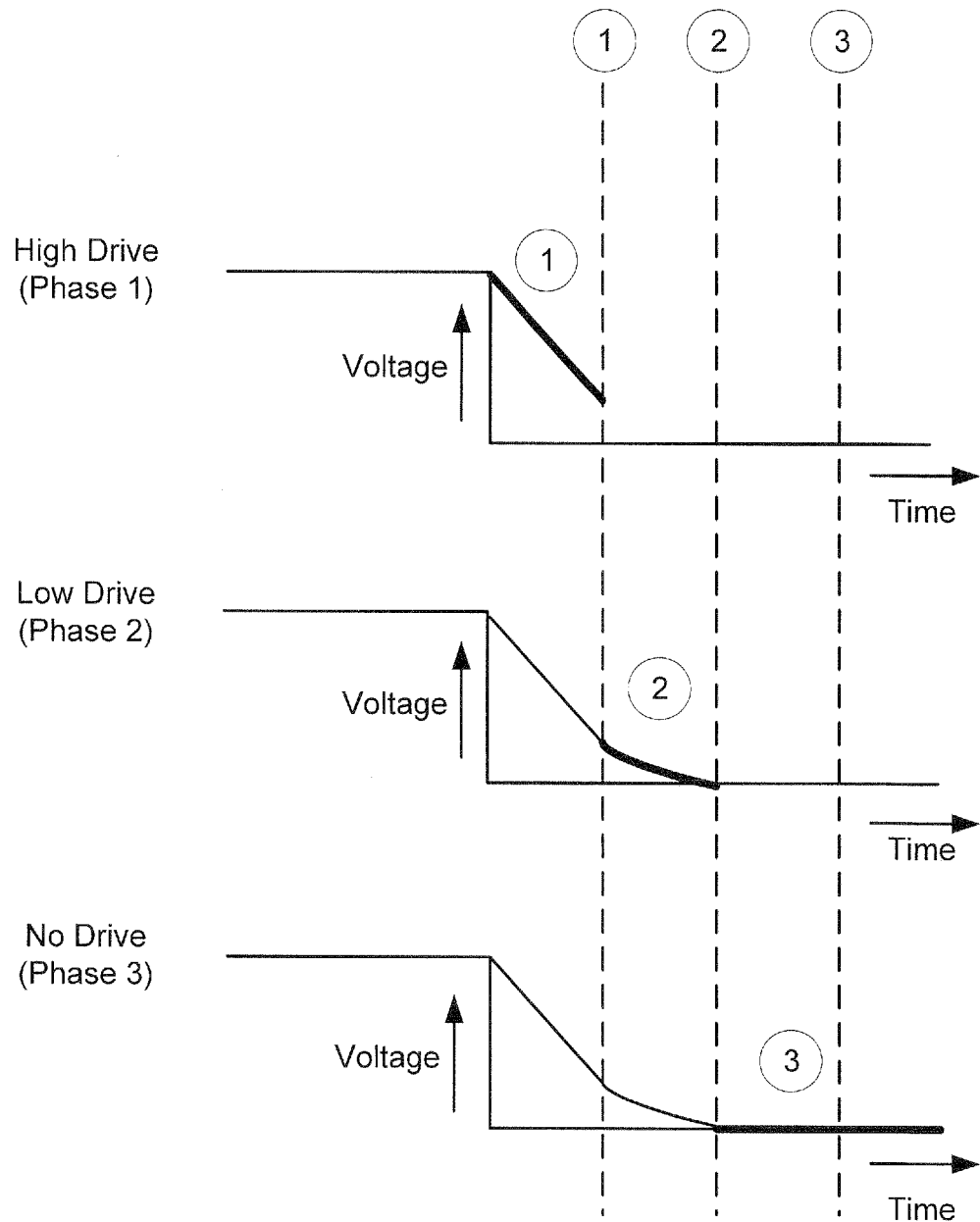
FIG. 3 is a diagram illustrating an example operation of the drive buffer of FIG. 1 to drive an LCD voltage from a high voltage state to a low voltage state.

FIG. 3 is a diagram illustrating an example operation of the drive buffer 200 of FIG. 1 to drive an LCD segment or pixel from a high voltage state to a low voltage state. Referring to FIG. 3, during phase 1, the drive buffer 200 may operate in a high-drive mode such that the high-drive circuit 400 is selected to drive the LCD segment or pixel voltage to a threshold voltage level. After the LCD segment or pixel voltage reaches the threshold voltage level, the drive buffer 200 may switch to a low-drive mode in phase 2. During the low-drive mode, the low-drive circuit 450 is selected to further modify the LCD segment or pixel voltage to approximate an input voltage of the drive buffer 200, which may have a value of 0 volts in this case. During the low-drive mode, the low-drive buffer 450 may maintain the LCD segment or pixel voltage at a constant level. The drive buffer 200 consumes less current in phase 2 than in phase 1, thereby reducing power consumption. After the LCD segment or pixel voltage reaches a desired level, the drive buffer 200 may cease to drive the LCD segment or pixel voltage during phase 3, further reducing power consumption. In some embodiments, the bias voltage generator may be turned off in phase 3 to further reduce power consumption. In some embodiments, the low-drive buffer 450 may be active concurrently with the high-drive buffer 400 to facilitate a transition from the high-drive mode to the low-drive mode.

Figure 4:
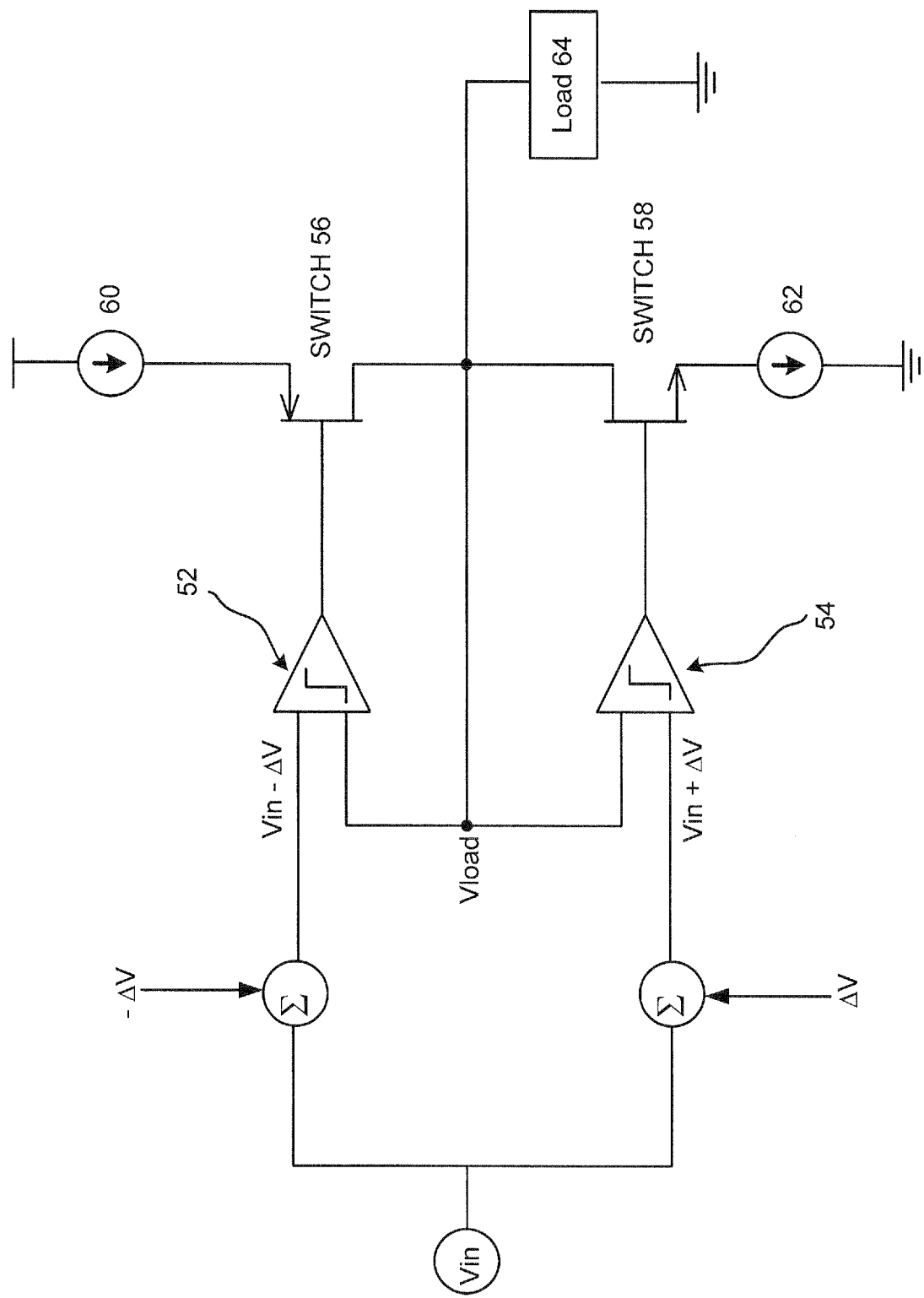
FIG. 4 is a schematic block diagram illustrating an example high-drive buffer of the driver buffer of FIG. 2.

FIG. 4 is a schematic block diagram illustrating an example high-drive buffer 400 of the driver buffer 200 in FIG. 2. Referring to FIG. 4, the example high-drive buffer 400 may include comparators 52 and 54, switches 56 and 58, current sources 60 and 62, to drive a load 64, e.g., an LCD segment or pixel. Comparators 52 and 54 compare multiple voltages or currents and switch their respective output to indicate which voltage or current is larger. The output of comparators 52 and 54 controls switches 56 and 58, respectively. In some embodiments, the switch 56 may be a PMOS, whereas the switch 58 may be an NMOS. In other embodiments, the switches 56 and 58 may be any other device capable of performing the functions described herein.

Vin represents an input voltage to the high-drive buffer 400. For example, the input voltage Vin may be one of the selected bias voltages V1, V2, and V3 in FIG. 1. An offset voltage $\Delta V$ may be a relatively small voltage compared to the input voltage Vin. A voltage window (Vin−$\Delta V$, Vin+$\Delta V$) may be a voltage range to drive the output of the high-drive buffer 400. The voltage window (Vin−$\Delta 7$, Vin+$\Delta V$) may be fixed or programmable. A load voltage Vload may represent instantaneous voltages associated with the load 64 as a function of time.

The comparator 52 compares the value of the input voltage minus the offset voltage or Vin−$\Delta V$ with the load voltage Vload. In some embodiments, the comparator 52 outputs a "1" when Vin−$\Delta V$ is less than the load voltage Vload, thus directing the switch 56 to be turned off. Otherwise, the comparator 52 outputs a "0" when Vin−$\Delta V$ is greater than the load voltage Vload, thus directing the switch 56 to be turned on.

The Comparator 54 compares the value of the input voltage plus the offset voltage or Vin+$\Delta V$ with the load voltage Vload. When the load voltage Vload is less than Vin+$\Delta V$, switch 58 is turned off. Otherwise, when the load voltage Vload is greater than Vin+$\Delta V$, the switch 58 is turned on.

When the switch 56 is on and the switch 58 is off, a large bias current may flow from the current source 60 to the load 64 to charge the load 64 until the load voltage Vload reaches a value within the window (Vin−$\Delta V$, Vin+$\Delta V$). Once the load voltage Vload is charged to a value within the window (Vin−$\Delta V$, Vin+$\Delta V$), both switches 56 and 58 may be off. When both switches 56 and 58 are off, the high-drive buffer 400 may ceases to drive the load 64. The low-drive circuit 450 may then be activated to modify or adjust the load voltage Vload to approximate the input voltage Vin and to stabilize the load voltage Vload at a substantially constant level.

On the other hand, when the switch 56 is off and the switch 58 is on, a large bias current may flow from the load 64 to the current source 62 to discharge the load 64 until the load voltage Vload reaches a value within the window (Vin−$\Delta V$, Vin+$\Delta V$). Once the load voltage Vload is discharged to a value within the window (Vin−$\Delta V$, Vin+$\Delta V$), both switches 56 and 58 may be off. When both switches 56 and 58 are off, the high-drive buffer 400 may ceases to drive the load 64. The low-drive circuit 450 may then be activated to modify or adjust the load voltage Vload to approximate the input voltage Vin and to stabilize the load voltage Vload at a substantially constant level.

In some embodiments, the low-drive buffer 450 may be active concurrently with the high-drive buffer 400 to facilitate a transition from a high-drive mode to a low-drive mode.

Figure 5:
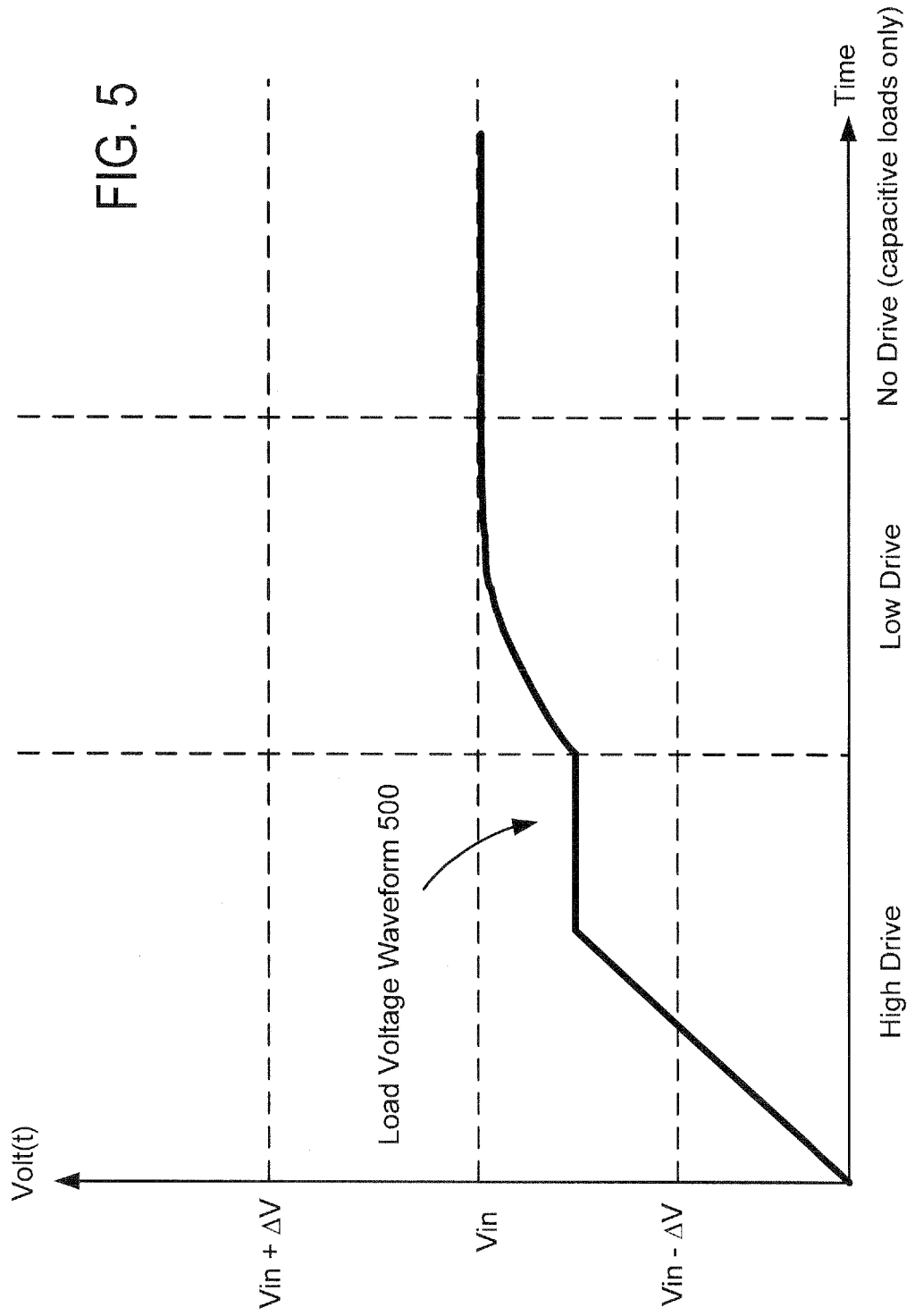
FIG. 5 is a diagram illustrating an example operation of the drive buffer of FIG. 1 for an example LCD voltage waveform.

FIG. 5 is a diagram illustrating an example operation of the drive buffer 200 of FIG. 1 for an example LCD voltage waveform 500. Referring to FIG. 5. Vin represents an input voltage to the high-drive buffer 400. The input voltage Vin may be one of the selected bias voltages V1, V2, and V3 in FIG. 1. An offset voltage $\Delta V$ may be a relatively small voltage compared to the input voltage Vin. A voltage window (Vin−$\Delta V$, Vin+$\Delta V$) may be a voltage range to drive the output of the drive buffer 200. The LCD voltage waveform 500 may represent instantaneous voltages associated with an LCD segment or pixel as a function of time.

The drive buffer 200 may operate in a high-drive mode such that the high-drive buffer 400 is selected to drive an LCD voltage to a value within the voltage window (Vin−$\Delta V$, Vin+$\Delta V$). Subsequently, the driver buffer 200 may switch to a low-drive mode. During the low-drive mode, the low-drive buffer 450 is selected to modify the LCD voltage to approximate the input voltage Vin. During the low-drive mode, the low-drive buffer 450 may compensate the leakage of the LCD segment or pixel and stabilize the LCD voltage to maintain a constant voltage level. After the LCD voltage reaches a desirable voltage level, the drive buffer 200 may switched to a no-drive mode, in which the high-drive buffer 400, the low-drive buffer 450, and the bias voltage generator may be turned off, further reducing power consumption FIG. 6 is a flow diagram 600 illustrating an example use of the passive matrix LCD driver circuit 100 of FIG. 1.

Figure 6:
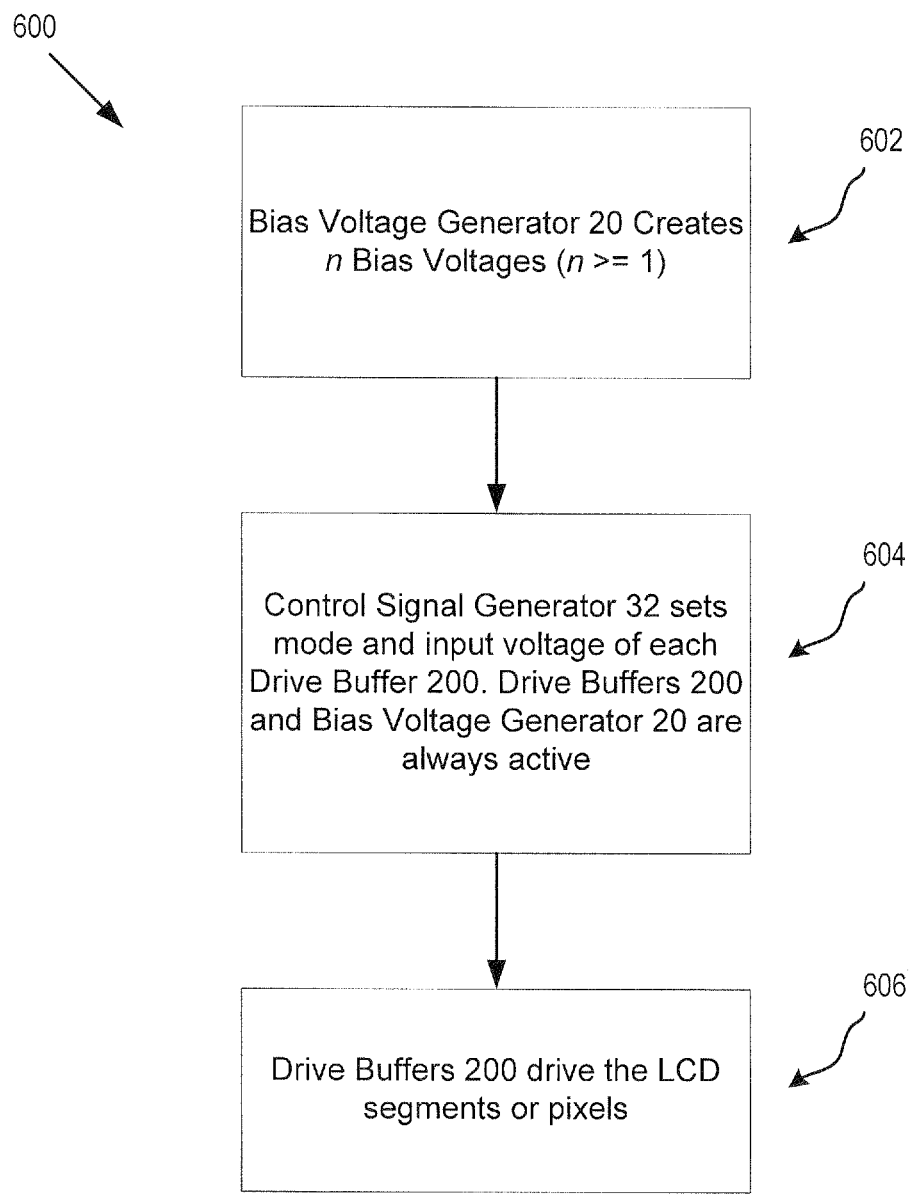
FIG. 6 is a flow diagram illustrating an example use of the passive matrix LCD driver circuit of FIG. 1.

Referring to FIG. 6, at step 602, the bias voltage generator 20 generates n bias voltages for driving the LCD segments or pixels. The n bias voltages may each represent a different voltage level. At step 604, the control signal generator 32 sets the appropriate driving mode and the input voltage of each drive buffer 200 by generating appropriate signals to the common driver circuit 22, the segment driver circuit 24, and the drive buffer 200. Additionally, both the bias voltage generator 20 and the drive buffer 200 are kept active all the time. At step 606, the drive buffer 200 drives the LCD segments or pixels according to the driving mode and the input voltage of the drive buffer 200.

Figure 7:
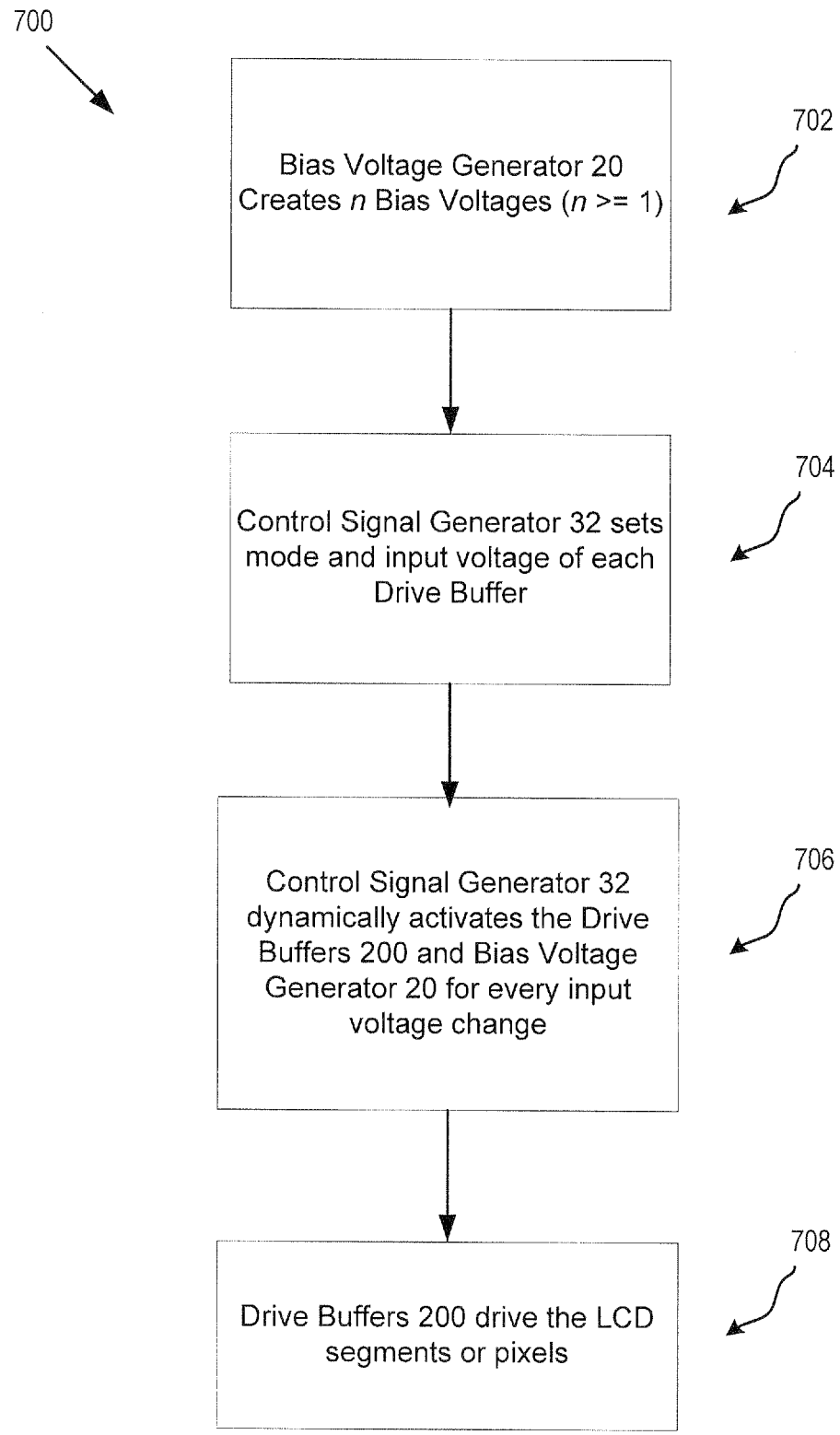
FIG. 7 is a flow diagram illustrating an example use of the passive matrix LCD driver circuit of FIG. 1.

FIG. 7 is a flow diagram 700 illustrating an example use of the passive matrix LCD driver circuit 100 of FIG. 1.

Referring to FIG. 7, at step 702, the bias voltage generator 20 generates n bias voltages for driving the LCD segments or pixels. The n bias voltages may each represent a different voltage level. At step 704, the control signal generator 32 sets the appropriate driving mode and the input voltage of each drive buffer 200 by generating appropriate signals to the common driver circuit 22, the segment driver circuit 24, and the drive buffer 200. At step 706, the control signal generator 32 dynamically activates the bias voltage generator 20 and the drive buffer 200 for every input voltage change. At step 708, the drive buffer 200 drives the LCD segments or pixels according to the driving mode and the input voltage of the drive buffer 200.

FIG. 8 is a flow diagram 800 illustrating an example use of the passive matrix LCD driver circuit 100 of FIG. 1.

Referring to FIG. 8, at step 802, the bias voltage generator 20 generates n bias voltages for driving the LCD segments or pixels. The n bias voltages may each represent a different voltage level. At step 804, the control signal generator 32 sets the appropriate driving mode and the input voltage of each drive buffer 200 by generating appropriate signals to the common driver circuit 22, the segment driver circuit 24, and the drive buffer 200. At step 806, the control signal generator 32 dynamically activates the bias voltage generator 20 and the drive buffer 200 for every input voltage change, as well as between every input voltage change. At step 808, the drive buffer 200 drives the LCD segments or pixels according to the driving mode and the input voltage of the drive buffer 200.

Embodiments of the invention relate to a method and apparatus to reduce power consumption in a passive matrix LCD driver circuit by actively using a plurality of drive buffers 200 and a bias generator 20 to drive an LCD segment or pixel. Each drive buffer 200 may operate in a high-drive mode and a low-drive mode. During the high-drive mode, a high-driver buffer 400 is selected to drive the LCD segment or pixel voltage to a threshold voltage level. Subsequently, the driver buffer 200 may switch to a low-drive mode. During the low-drive mode, a low-drive buffer 450 is selected to modify the LCD segment or pixel voltage to approximate an input voltage of the drive buffer 200, and to maintain a constant voltage level at the output of the drive buffer 200. During the low-drive mode, the drive buffer 200 consumes less current than in the high-drive mode, thus reducing power consumption. In some embodiments, the drive buffer 200 may operate in a no-drive mode, in which the drive buffer 200 and the bias voltage generator 20 may be completely turned off, to further reduce power consumption. The drive buffer 200 may be used to drive capacitive loads other than an LCD segment or pixel, as well as partially-resistive loads and inductive loads, using the principles described above.

Further modifications and alternative embodiments of this invention will be apparent to those skilled in the art in view of this description. For example, the drive buffer 200 may be implemented using two discrete drivers, such as the high-drive buffer 400 and the low-drive buffer 450, or alternatively be implemented using a single driver with multiple modes, such as a low-drive mode and a high-drive mode, by changing a bias current of the drive buffer 200 between a high current mode and a low current mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. An apparatus, comprising:
   a bias voltage generator to generate a plurality of bias voltages; and
   a drive buffer to drive a passive liquid crystal display (LCD) pixel or segment from a particular one of the bias voltages, wherein the drive buffer actively drives the passive LCD segment or pixel in a first phase, and wherein the drive buffer comprises:
     a first buffer configured to actively drive a voltage, applied to the passive LCD pixel or segment, to a threshold level that is different from the particular one of the bias voltages, wherein the first buffer includes a current source that is configured to drive the voltage applied to the passive LCD pixel or segment to the threshold level; and
     a second buffer in parallel with the first buffer configured to actively further modify the voltage, applied to the passive LCD pixel or segment, from the threshold level to approximate the particular one of the bias voltages;
   wherein the drive buffer is configured to actively drive the passive LCD segment or pixel by adjusting the voltage, applied to the passive LCD pixel or segment, to approximate the particular one of the bias voltages, and by compensating a leakage associated with the passive LCD pixel or segment to provide a constant voltage at the passive LCD pixel or segment in a low-drive mode; and
   wherein the second buffer is activated during the low-drive mode.

2. The apparatus of claim 1, wherein the second buffer is configured to compensate the leakage associated with the passive LCD pixel or segment to provide the constant voltage at the passive LCD pixel or segment.

3. The apparatus of claim 1, further comprising a control circuit having a control signal generator configured to generate one or more control signals to select between the first buffer and the second buffer.

4. The apparatus of claim 1, wherein the driver buffer is configured to actively drive the passive LCD segment or pixel in the first phase by driving the voltage, applied to the passive LCD pixel or segment, to the threshold voltage level in a high-drive mode.

5. The apparatus of claim 4, where the first buffer is activated during the high-drive mode.

6. The apparatus of claim 1, wherein the drive buffer is configured to cease to drive the passive LCD segment or pixel during a second phase by ceasing to drive the passive LCD segment or pixel in a no-drive mode when the voltage applied to the passive LCD pixel or segment reaches a desired voltage level.

7. The apparatus of claim 6, where at least one of the bias voltage generator or the drive buffer is turned off during the no-drive mode.

8. The apparatus of claim 1, where the second buffer uses an offset cancellation technique.

9. A method, comprising:
generating a plurality of bias voltages that include an input voltage;
actively driving a voltage, applied to a passive liquid crystal display (LCD) segment or pixel, to a threshold level that is different from the input voltage in a first phase using a first buffer, wherein the first buffer includes a current source that is configured to drive the voltage applied to the passive LCD segment or pixel to the threshold level;
actively driving the passive LCD segment or pixel to further modify the voltage, applied to the passive LCD segment or pixel, from the threshold level using a second buffer to approximate the input voltage in the first phase, wherein the second buffer is activated during a low-drive mode in the first phase;
compensating a leakage associated with the passive LCD segment or pixel to maintain the voltage, applied to the passive LCD segment or pixel, at a substantially constant level during the low-drive mode in the first phase; and
ceasing to drive the passive LCD segment or pixel in a second phase.

10. The method of claim 9, wherein the method includes ceasing to drive the passive LCD segment or pixel after the voltage applied to the passive LCD segment or pixel reaches a desired level in a no-drive mode during the second phase.

11. The method of claim 10, wherein the method includes actively driving the passive LCD segment or pixel in one of a high-drive mode or the low-drive mode during the first phase.

12. The method of claim 11, wherein the method includes generating one or more control signals to select one of the high-drive mode, the low-drive mode, or the no-drive mode.

13. The method of claim 11, wherein the method includes canceling a voltage offset using an amplifier with chopper offset cancellation in the low-drive mode.

14. The method of claim 10, wherein the method includes turning off at least one of the bias voltage generator and the drive buffer in the no-drive mode.

15. An apparatus, comprising:
means for generating a plurality of bias voltages that include an input voltage;
means for actively driving a voltage, applied to a passive liquid crystal display (LCD) segment or pixel, to a threshold level that is different from the input voltage in a first phase, wherein the means include a current source that is configured to drive the voltage applied to the passive LCD segment or pixel to the threshold level;
means for actively further modifying the voltage, applied to the passive LCD segment or pixel, from the threshold level to approximate the input voltage in the first phase, wherein the means are activated during a low-drive mode in the first phase;
means for compensating a leakage associated with the passive LCD segment or pixel to maintain the voltage applied to the passive LCD segment or pixel at a substantially constant level during the low-drive mode in the first phase; and
means for ceasing to drive the passive LCD segment or pixel in a second phase.

16. The apparatus of claim 15, wherein the apparatus includes means for ceasing to drive the passive LCD segment or pixel in a no-drive mode during the second phase after the voltage applied to the passive LCD segment or pixel reaches a desired level.

17. The apparatus of claim 16, wherein the apparatus includes means for actively driving the passive LCD segment or pixel in one of a high-drive mode or the low-drive mode during the first phase.

18. The apparatus of claim 17, wherein the apparatus includes means for selecting one of the high-drive mode, the low-drive mode, or the no-drive mode.

* * * * *